United States Patent [19]
Ho et al.

[11] Patent Number: 5,518,805
[45] Date of Patent: May 21, 1996

[54] HILLOCK-FREE MULTILAYER METAL LINES FOR HIGH PERFORMANCE THIN FILM STRUCTURES

[75] Inventors: Jackson H. Ho, Palo Alto; Ronald T. Fulks, Mountain View; Tzu-Chin Chuang, Saratoga, all of Calif.

[73] Assignee: Xerox Corporation, Stamford, Conn.

[21] Appl. No.: 234,897

[22] Filed: Apr. 28, 1994

[51] Int. Cl.$^6$ .............................. B32B 7/02; B32B 51/01
[52] U.S. Cl. ..................... 428/213; 428/457; 428/650; 428/651; 428/216; 437/192; 437/194
[58] Field of Search ...................... 428/615, 630, 428/635, 337, 650, 651, 457, 213, 215, 216; 257/750, 763, 764, 765, 766, 767, 771; 437/192, 194, 189, 190

[56] References Cited

U.S. PATENT DOCUMENTS

| | | | |
|---|---|---|---|
| 4,522,890 | 6/1985 | Volkers | 428/624 |
| 4,673,623 | 6/1987 | Gardner | 428/620 |
| 5,071,714 | 12/1991 | Rodbell | 428/620 |
| 5,148,259 | 9/1992 | Kato | 257/771 |

Primary Examiner—Ellis P. Robinson
Assistant Examiner—Leonidas J. Jones, III
Attorney, Agent, or Firm—Stuart P. Kaler; Tracy L. Hurt

[57] ABSTRACT

The present invention is a novel multilayered structure comprising alternating layers of a base metal and a metal selected from a group of barrier metals. The base metal, in any given layer, is deposited to a thickness less than its critical thickness—a thickness beyond which hillocks are more likely to form for a given temperature. Between each such layer of base metal, a layer of barrier metal is interposed. The intervening layer of barrier metal acts to suppress the formation of hillocks in the base metal.

6 Claims, 3 Drawing Sheets

HILLOCK-FREE MULTILAYER METAL LINES FOR HIGH PERFORMANCE THIN FILM STRUCTURES

FIELD OF THE INVENTION

The present invention relates in general to multilayered metal lines designed to suppress the formation of hillocks and, in particular, to hillock-free multilayered metal lines for use in high performance thin film structures.

BACKGROUND OF THE INVENTION

In many applications using thin film structures (e.g. integrated circuits (ICs), active matrix liquid crystal displays (AMLCDs) and the like), low resistivity of the metal lines in those structures is important for high performance. Low resistivity in metal lines minimizes RC delay which translates into, for example, faster screen refresh rates for AMLCDs. Refractory metals, such as chromium (Cr), molybdenum (Mo), tantalum (Ta), and tungsten (W), have too high a resistance for use in high performance displays. Additionally, the cost of refractory metals as standard metal lines is greater than other non-refractory metals. From the standpoint of low resistance and cost, aluminum is a desirable line metal.

Aluminum, however, has an unfortunate tendency to form defects, called "hillocks", under certain deposition conditions. These defects are characterized by protrusions that form on the side of the aluminum that is parallel to and away from the substrate. Hillocks are often times fatal to the correct operation of the IC or active matrix because the protrusions may "punch" through several layers overlying the aluminum. For these reasons, many attempts have been made to suppress the formation of hillocks during the fabrication process.

The first of these techniques employs a separate metal (such as tantalum) capping layer over the aluminum metal. This technique has been regarded as successful for controlling the formation of hillocks in the fabrication process. One drawback, however, is that a separate masking fabrication step is needed to pattern the capping metal—otherwise the capping metal layer, extending over the entire plate, is more likely to cause a short. This is in contrast to a dielectric capping layer which need not be patterned to avoid such an electrical short. This additional masking step for the capping metal adds to the overall cost of fabrication and production.

Another drawback to this technique is the greater line width of the resultant capped structure. In order for capping to successfully avoid the formation of hillocks, the capping layer must be exactly abutting the aluminum on all sides. If the registration of the capping metal is less than accurately placed, then hillocks have been known to form. At the present error tolerances of photolithography, the additional thickness of the capping metal consumes a sizable percentage of the total line width. Because the capping metal is generally not as good a conductor as aluminum, the resistivity of the capped metal line is greater than for a line of aluminum of the same width.

A second technique caps metal with an oxide layer by means of an anodic process. One such attempt is described in the article: "P-6: Low-Resistivity Tantalum Film for TFT Gate Line" by Shimada et al., published in SID 93 Digest at page 467. Shimada et al. describe the anodic growth of a tantalum oxide layer on tantalum which is additionally capped by a layer of $SiN_x$.

The same anodic process has been used to grow a layer of aluminum oxide on aluminum. The problem with such oxides is that they are generally regarded as poor insulators as well as poor suppressors of hillock formation. It has been reported that small defects in the oxide layer ("pinholes") may form, through which hillocks may protrude. Another drawback with the use of anodic oxide is that the anodic process generally requires the use of potentially contaminating electrolytes and also requires a means of connecting all the patterned lines to achieve anodic growth on all the lines simultaneously.

Additionally, neither of the above methods for controlling hillocks simultaneously addresses the concern of fabricating low resistive metal layers. To address both concerns simultaneously, the factors (e.g. the temperature of later fabrication steps, the thickness of the metal layer, and the like) contributing to the formation of hillocks must be considered. Essentially, metal, such as aluminum, is deposited by physical vapor deposition (i.e. evaporation and sputtering). The temperature of the substrate during aluminum deposition may be varied according to the desired properties of the aluminum. For example, at higher deposition temperatures, the resistivity of aluminum decreases and its grain size increases.

Patterning of the aluminum is done at room temperature by standard lithographic process. After patterning, a dielectric layer, such as an SiN layer, is deposited at temperatures in the range of 300–380 degrees C. This high temperature is generally necessary to achieve good dielectric properties. This reheating causes stress in the aluminum metal because of a mismatch in the coefficients of thermal expansion between the substrate (usually glass in an active matrix liquid crystal displays) and aluminum. The additional stress is relieved in the form of hillocks, whose growth can measure in size from tenths of a micron to several microns.

Apart from temperature, the growth of hillocks is also dependent upon the thickness of the deposited metal layer. As a general rule, the thicker the layer, the larger the strain energy of the film, and the more likely is the possibility that hillocks will form at a given temperature. Thus, it is possible to reduce the amount of hillock formation at a given temperature by reducing the thickness of the metal layer in question. It is well known that, for a given temperature, a "critical" thickness exists—below which hillocks are unlikely to form.

Reducing the thickness of the metal layer below the critical thickness, however, has one major drawback—comparatively thin metal layers have comparatively high resistivity. For the purposes of high performance thin film structures, thin metal layers are generally not acceptable.

Thus, there is a need for the suppression of the hillocks in metal layers without reducing the resistivity of the metal layer.

It is an object of the present invention to create metal layers that are substantially hillock-free while simultaneously of low resistivity.

SUMMARY OF THE INVENTION

In summary, the present invention is a novel multilayer structure comprising alternating layers of a base metal and a barrier metal. The base metal, in any given layer, is deposited to a thickness less than its critical thickness for hillock formation—a thickness beyond which hillocks are more likely to form for a given temperature. Between each such layer of base metal, a layer of barrier metal is interposed. The intervening layer of barrier metal acts to isolate the base metal layers from each other. Since each layer is under the critical thickness, no hillocks will form.

One advantage of the present invention is creating low resistive metal lines for high performance thin film structures. Because the resistivity of a line is inversely proportional to the cross section of the metal layer, the multilayered structure of the present invention offers a greater total cross section of the base metal than a single layer of the base metal—while suppressing the formation of hillocks.

Another advantage of the present invention is small line widths. Because the barrier metal of the present invention is layered on the base metal, and not capping the base metal, there is no additional width added to the line.

BRIEF DESCRIPTION OF THE DRAWINGS

The purpose and advantages of the present invention will be apparent to those skilled in the art from the following detailed description in conjunction with the drawings.

DETAILED DESCRIPTION OF THE PREFERRED EMBODIMENTS

The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the present invention as defined by the appended claims. Thus, the present invention is not intended to be limited to the embodiment shown, but is to be accorded the widest scope consistent with the principles and features disclosed herein.

Figure 1:
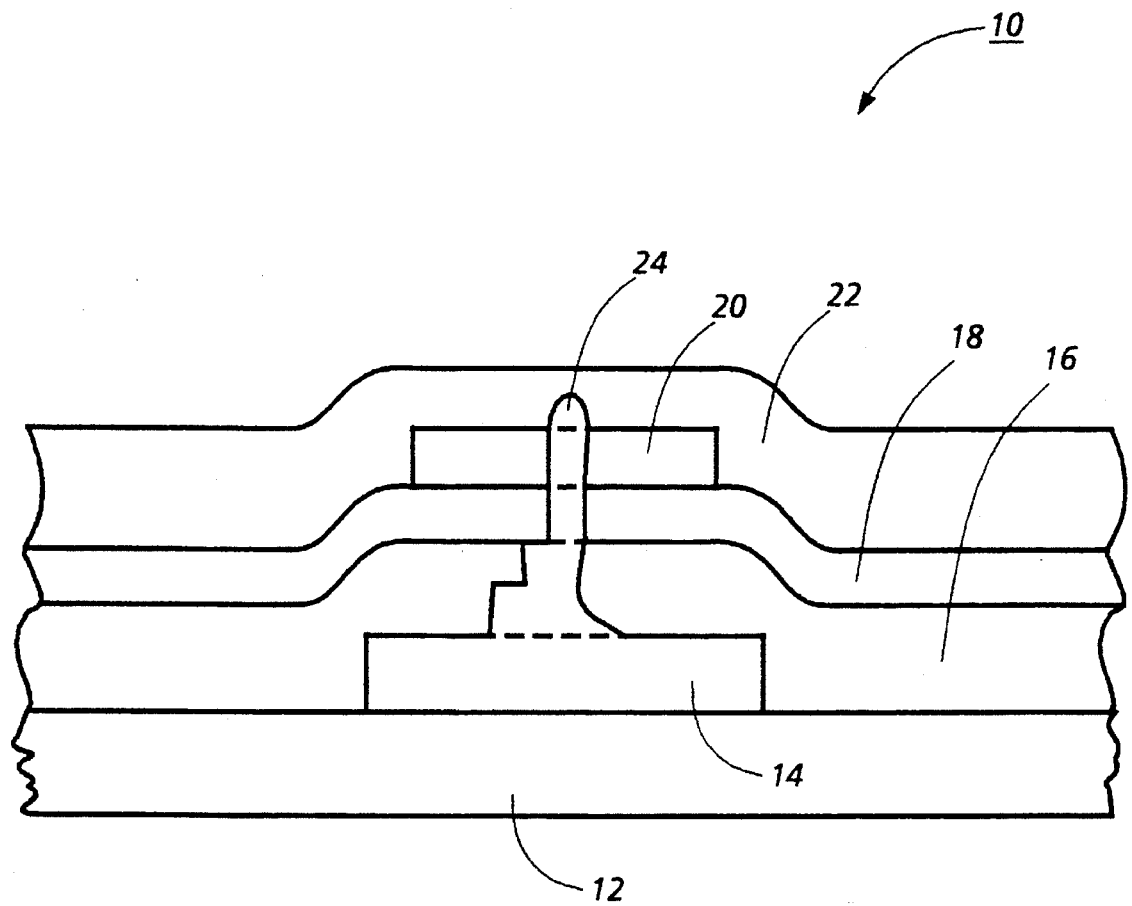
FIG. 1 depicts the formation of a hillock in a metal layer during the fabrication process.

Referring now to FIG. 1, the formation of a hillock is depicted in a thin film structure, such as structure 10. While structure 10 is shown comprising several particular layers, it will be appreciated that the choice of any particular layer is merely made for illustrative purposes and, further, that the problem of hillock formation in metal layers is common to various structures using various materials. Additionally, while structure 10 may resemble a thin film transistor (TFT) in the making, problems of hillock formation are also fatal to metal line crossover formations, capacitors, or any other structure where the breach of a layer's integrity may cause operational malfunction.

Structure 10 comprises substrate 12 (usually glass) upon which a metal layer 14 (e.g. aluminum) is deposited and patterned. A bottom dielectric layer 16 (comprising of SiN or the like) acts as an intervening insulator between metal layer 14 and active layer 18. A top dielectric layer 20 and another metal line 22 are deposited atop an active layer 18. As can be seen from FIG. 1, hillock 24 has formed from the metal layer 14 and has "punched" through several layers (layers 16, 18, 20, and 22), creating a "short" between metal layer 14 and metal layer 22. A defect, such as the one depicted, is most likely fatal to the correct operation of the structure.

Figure 2A:
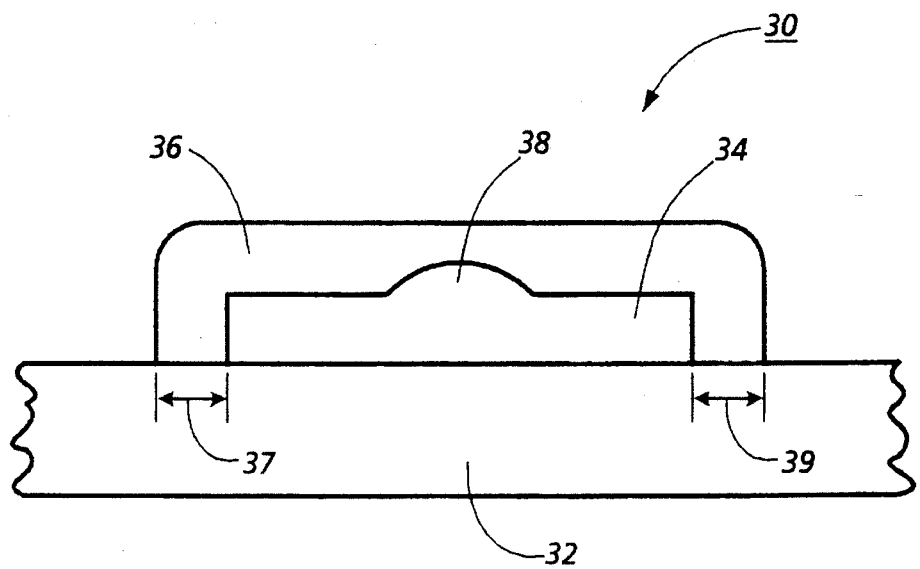
FIG. 2A–2B depict two separate attempts to control the growth of hillocks in metal layers.
Figure 2B:
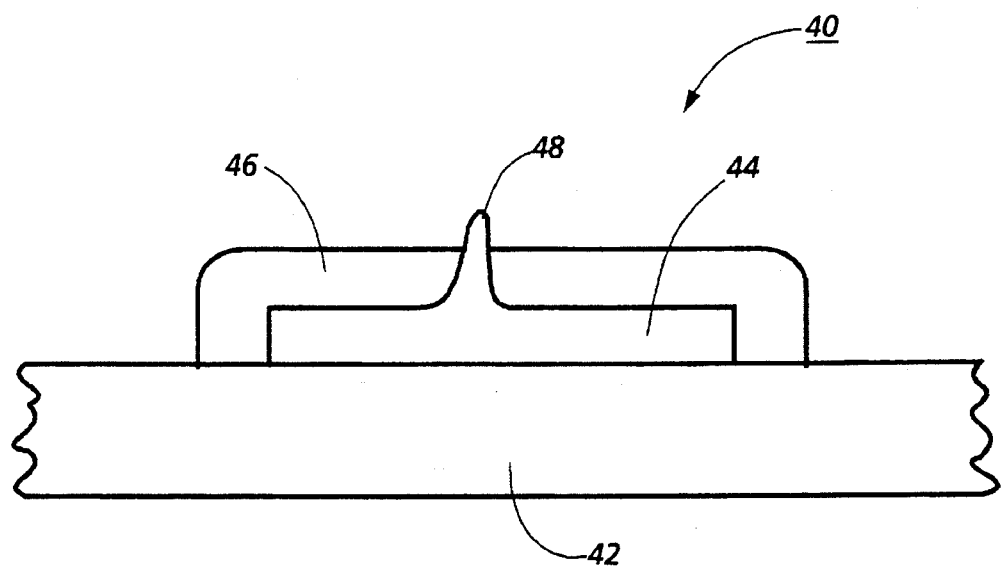

Because hillocks can have such devastating effects on the operation of thin film structures, several attempts have been made to control or suppress their growth in the fabrication process. FIG. 2A and 2B depict two such attempts. FIG. 2A shows the capping of a base metal layer 34, such as aluminum, by another metal layer 36, such as tantalum, both deposited upon a substrate 32. As depicted by a slight raise 38 in the surface of the metal layer 34, this method is generally known to be relatively successful in the suppression of hillocks. One drawback with this particular method, however, is increased cost of fabrication. The additional metal capping layer generally requires a separate masking step. Masking is generally known to be a costly fabrication step.

Another drawback of this method is also depicted in FIG. 2A—increased line width. Because metal layer 36 is a capping layer, it must extend and register exactly with all sides of the base metal 34. The side registration of the capping metal with the base metal adds additional width equal to the sum of distances 37 and 39. Because this additional width is bounded below by the error tolerance of current photolithographic methods, this additional width adds a sizable percentage to the total width. Additionally, because the capping metal is usually of higher resistivity than the base metal, the resistivity of the line is greater than a line of the same width comprising only the base metal.

FIG. 2B depicts a second attempts at suppressing the formation of hillocks. A metal layer 44 is deposited and patterned on substrate 42. Then, upon the metal layer, an oxide layer is formed upon the metal itself by an anodic process (which is similar to electroplating). This method is employed, for example, on a tantalum metal line, as described in the Shimada et al. article referenced above.

Not only does the anodic process itself increase the cost of manufacturing, it has been met with mixed results. As shown in FIG. 2B, it is known that small hillocks may form in defects (called "pinholes") occurring in the surface of the oxide layer. Hillocks, such as hillock 48, have been known to form in such pinhole defects—effectively nullifying the desired effect of the oxide as a capping layer.

Figure 3:
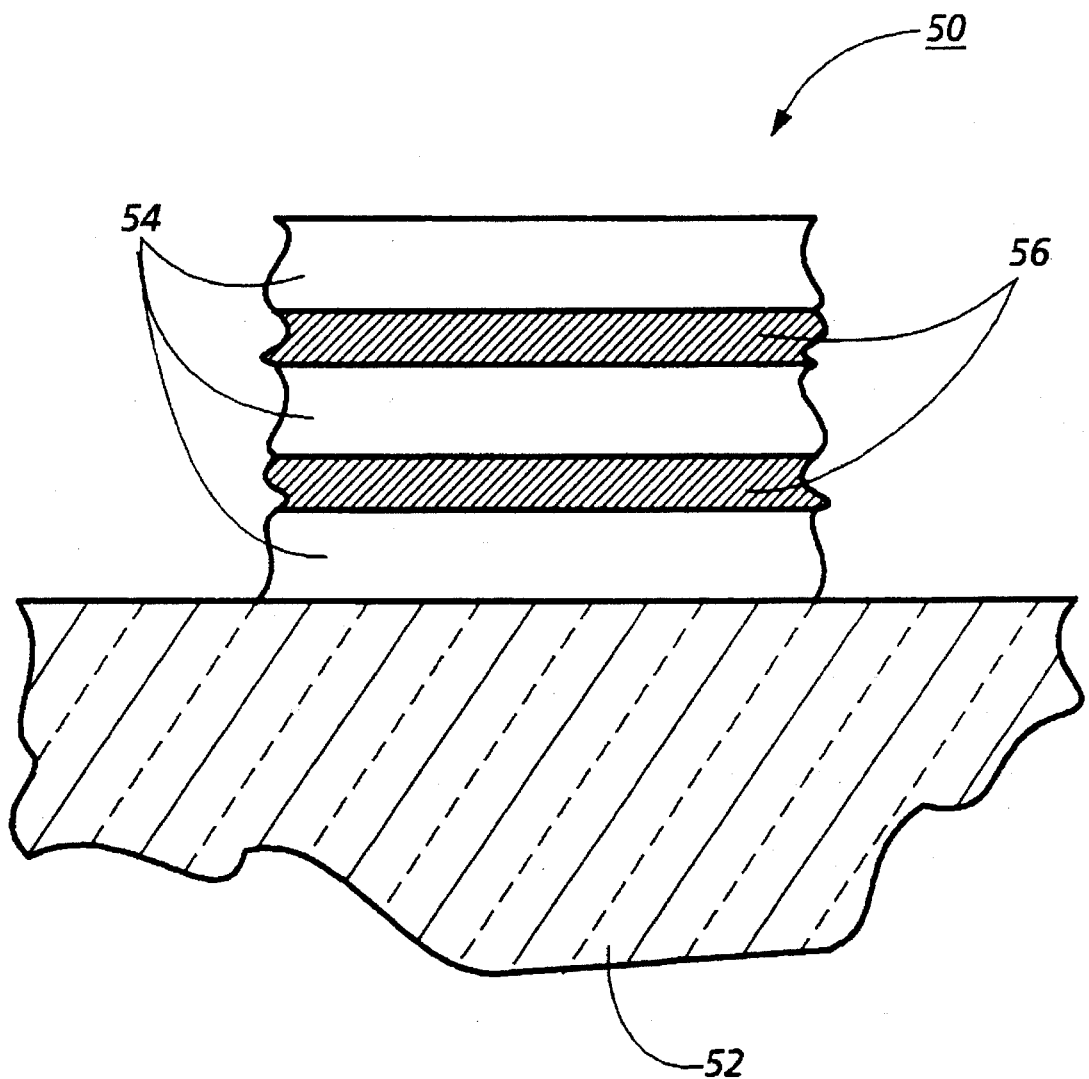
FIG. 3 depicts the multilayered structure made in accordance with the principles of the present invention.

FIG. 3 depicts a multilayered structure 50, made in accordance with the principles of the present invention, for a high performance thin film structure. On substrate 52, there is deposited alternating sublayers of base metal 54 and barrier metal 56. In one embodiment of the present invention, the base metal is aluminum (Al) and the barrier metal comprises a refractory metal such as chromium, molybdenum, tantalum and tungsten or some alloy thereof such as titanium-tungsten (TiW).

The thin film structure is constructed by a fabrication process that comprises a number of fabrication steps. Each step has an associated temperature. Thus, there is a known maximum temperature for the entire fabrication process to which the Al will be exposed. It is therefore ensured that each deposition of the Al layers is thinner than the critical thickness determined for that maximum temperature. The barrier metal is used to prevent adjacent Al layers from merging with each other. It is known that TiW, W and TiN are acceptable barriers for Al up to 550 degrees C.

It will be appreciated that the multilayered structure depicted in FIG. 3 may have any number of layers greater than two and starting in any particular order desired (e.g. either barrier metal first or base metal first). Additionally, it is unimportant that the all of the barrier metal layers be made of a single metal or alloy. The important aspects of the present invention are that any layer of the base metal is less than the critical thickness and that any two adjacent layers of the base metal is separated by a barrier metal of some type.

It will also be appreciated that the critical thickness for any given fabrication condition is well known to those in the art. For aluminum, this critical thickness is known to be about 300 to 800 Å, depending upon the particular fabrication conditions. Additional discussion of the fabrication of the presently claimed structures is disclosed in commonly assigned U.S. patent application entitled "Thin-Film Structure with Tapered Feature", application Ser. No. 08/235,010 (Attorney Docket Number D/94257) which is filed concurrently herewith and is hereby incorporated by reference.

A three layer sputter deposited film comprising 600 Å of Al, 150 Å of TiW and 600 Å of Al on a substrate of $SiO_2$ has been shown to withstand 400 degrees C for one hour without hillock formation. The sheet resistivity of this film stack is measured to be 0.36 ohm/sq. as opposed to 0.25 ohm/sq. for an Al film (having 2% copper) of the same thickness.

In summary, the present invention is a novel multilayered structure comprising alternating layers of a base metal and a metal selected from a group of barrier metals. The base metal, in any given layer, is deposited to a thickness less than its critical thickness—a thickness beyond which hillocks are more likely to form for a given temperature. Between each such layer of base metal, a layer of barrier metal is interposed. The intervening layer of barrier metal acts to isolate the base metal layers from each other—thus, keeping the effective thickness of each base metal layer below the critical thickness.

One advantage of the present invention is creating low resistive metal lines for high performance thin film structures. Because the resistivity of a line is inversely proportional to the cross section of the metal layer, the multilayered structure of the present invention offers a greater total cross section of the base metal than a single layer of the base metal—while suppressing the formation of hillocks.

Another advantage of the present invention is small line widths. Because the barrier metal of the present invention is layered on the base metal, and not capping the base metal, there is no additional width added to the line.

What is claimed:

1. A thin film structure constructed by a fabrication process, said structure comprising:

a substrate;

a plurality of alternating layers of base metal and barrier metal, said plurality of layers supported on said substrate, each layer of said base metal consisting of aluminum, being hillock-free and having a thickness of 800 Å, or less, and a layer of said barrier metal being interposed between any two layers of said base metal.

2. The thin film structure as recited in claim 1 wherein said barrier metal comprises a refractory metal.

3. The thin film structure as recited in claim 1 wherein said barrier metal comprises a refractory metal alloy.

4. The thin film structure as recited in claim 1 wherein said barrier metal is selected from a group consisting of a refractory metal and a refractory metal alloy.

5. The thin film structure as recited in claim 1 wherein said barrier metal is selected from a group consisting of chromium, molybdenum, tantalum, and tungsten.

6. The thin film structure as recited in claim 1 wherein said barrier metal comprises an alloy of a plurality of metals, at least one of said plurality of metals is selected from a group consisting of chromium, molybdenum, tantalum, and tungsten.

* * * * *